United States Patent [19]
Gates

[11] Patent Number: 6,160,223
[45] Date of Patent: Dec. 12, 2000

[54] HEAT PIPE ATTACHED TO A PRINTED WIRING BOARD

[75] Inventor: Frank Vernon Gates, Township of Roxbury, Morris County, N.J.

[73] Assignee: AT&T Corporation, New York, N.Y.

[21] Appl. No.: 09/089,538

[22] Filed: Jun. 3, 1998

[51] Int. Cl.[7] .................................................. H05K 1/00

[52] U.S. Cl. ........................................ 174/252; 361/719

[58] Field of Search ............................. 174/252; 361/687, 361/688, 696, 697, 704, 707, 709, 708, 711, 712, 713, 717, 719, 722

[56] References Cited
U.S. PATENT DOCUMENTS 5,975,195  12/1999  Lowry et al. ............................. 165/86

Primary Examiner—Jeffrey Gaffin
Assistant Examiner—Kamand Cuneo
Attorney, Agent, or Firm—Morgan & Finnegan LLP

[57] ABSTRACT

A multi-layer printed wiring board includes multiple dielectric cores and conductive layers. The conductive layers include a first layer having a first thickness and a first set of line widths, and a second layer having a second thickness and a second set of line widths. The first thickness is greater than the second thickness. A heat pipe is attached to the printed willing board rather than to an integrated circuit with surface mounting, connection by through holes or with tabs.

10 Claims, 3 Drawing Sheets

HEAT PIPE ATTACHED TO A PRINTED WIRING BOARD

BACKGROUND OF THE INVENTION

1. Field of the Invention

This invention relates to dissipating heat from a printed wig board using a heat pipe.

2. Description of the Related Art

One common process for definition of signal traces on printed wiring boards is known as a subtractive process. In this process a panel consisting of a copper clad dielectric material is coated with a photoimagable polymer (photoresist). A phototool containing a negative image (clear traces with a black background) of the signal trace layer to be formed is placed over the photoresist coated panel and ultraviolet (UV) light is used to expose and crosslink the photoresist through the clear areas in the phototool, which correspond to the subtractive signal image. Unexposed areas of the photoresist are then removed in a developer solution. The traces are then defined in the copper by exposing the panel to a copper etching solution, where the photoresist acts to protect the copper beneath it while the remaining copper is removed. The photoresist is then removed to complete the process.

A multi-layer printed wiring board typically includes several non-conductive layers of epoxy (a dielectric), several plated-on layers on each side of the dielectric, with spacer layers ("spacers") in between. Traces are etched in each layer to make the various interconnects. One of the many layers of the multi-layer printed wiring board is typically for power while another layer is for ground. The other (non-power and ground) layers are typically thinner and have narrower traces than the power layer or the ground layer.

Increases in semiconductor chip input/output (I/O) in high-performance computers and other systems, and the shrinking size of consumer and automotive electronics are driving the increased wiring density of integrated circuits defined in single and multi-chip packages and printed wiring boards. See *Microelectronics Packaging Handbook,* 2nd edition, pp. II-63, II-64 and II-117 (1997) by Tummala, Rymaszewski, and Klopfenstein.

To achieve increased wiring density, the signal traces on multi-layer printed wiring boards, and the spaces between the signal traces, are becoming narrower. In such high-density high I/O printed wiring boards, more pin-outs project from each integrated circuit and from all of the integrated circuits than in past practice. On a standard high-density high I/O printed wiring board there can be as many as one hundred integrated circuits, each with fifty to one hundred (or more) leads or pin-outs. As trace widths become narrower, the power density on both the integrated circuits and the printed wiring boards is increasing.

Heat pipes are sealed hollow tubes of copper filled with alcohol or other fluid at low vapor pressure, which gives them the ability to transfer significant amounts of heat along their length with minimal temperature differential. Heat pipes are attached to individual integrated circuits populated on a printed wiring board to dissipate heat from the integrated circuits. Heat pipes are used, for example, in laptop computers.

The position, size, shape and location of the integrated circuits on the printed wiring board are determined before a heat pipe can be permanently attached to an individual integrated circuit. The printed wiring board and the surrounding electronics are often custom designed to accommodate the rigid physical structure of the heat pipe. Access to the printed wiring board and other components in case of repair is often difficult. As such, there continues to be a need for a heat pipe arrangement which eliminates or reduces these concerns.

SUMMARY OF THE INVENTION

According to an exemplary embodiment of the invention, a multi-layer printed wiring board includes one or more dielectric cores and conductive layers formed on the one or more dielectric cores. The conductive layers include a first group of layers having a first thickness and a first set of line widths, and a second group of layers having a second thickness and a second set of line widths. The first thickness is greater than the second thickness. According to an aspect of the invention, the line widths of the first set are greater than the line widths of the second set. A heat pipe is attached to some of the circuit traces on the thicker first group of layers.

The multi-layer printed wiring board is fabricated by forming a first group of layers on dielectric cores and forming a second group of layers on other dielectric cores such that the thickness of the first group of layers is greater than the thickness of the second group of layers. Then, the heat pipe is attached to circuit traces on the first group of layers of the multi-layer printed wiring board rather than to an integrated circuit mounted on the printed wiring board. Thickening and widening some of the copper layers of the multi-layer printed wiring board and attaching the heat pipe directly to the traces on the printed wiring board allows heat to be effectively dissipated from the integrated circuits to the heat pipe. As the design process evolves, heat pipes can be located before the size, shape or location of the integrated circuits are determined.

Other features and advantages of the invention will become apparent from the following detailed description, taken in conjunction with the accompanying drawings, which illustrate, by way of example, the features of the invention.

DETAILED DESCRIPTION

Figure 1:
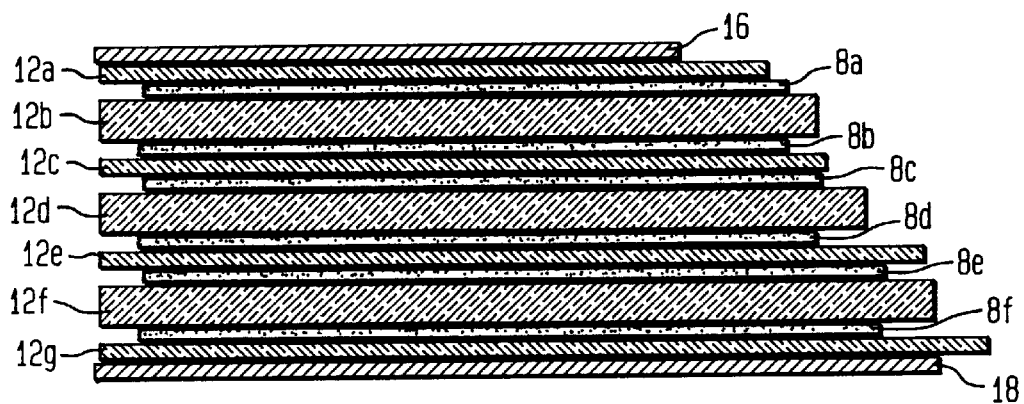
FIG. 1 is side view of a multi-layer printed wiring board in accordance with the principles of the invention.

As shown in the drawings for purposes of illustration, an apparatus includes a multi-layer printed wiring board having an array of integrated circuits populated thereon and a heat pipe attached to the multi-layer printed wiring board, rather than to one or more integrated circuits. The heat pipe is assembled to the multi-layer printed wiring board in a manner similar to how a standard integrated circuit is mounted on a multi-layer printed wiring board. Thickening and widening some of the copper layers of the multi-layer printed wiring board and attaching the heat pipe directly to the printed wiring board allows heat to be effectively dissipated from the integrated circuits to the heat pipe. Heat pipes can be attached before the size, shape or location of the integrated circuits are determined.

Modern high density/high power integrated circuits have a large number of pin-outs. The pin-outs make excellent heat conduction paths from the integrated circuits to the copper traces on the printed wiring board. Many layers of copper traces interconnect the hundreds of pin-outs on each integrated circuit to the other hundreds of integrated circuits on the printed wiring board. The layers of copper traces include a power distribution layer, a ground distribution layer, and other layers reserved for signal interconnections. The layers used for signal interconnections are relatively thin with respect to the power distribution layer and the ground distribution layer, and have closely spaced traces which better facilitate signal connectivity and required wiring board resolution.

FIG. 1 is a side elevational view of a multi-layer printed wiring board in accordance with a specific embodiment of the invention. With respect to FIG. 1, the exemplary multi-layer printed wiring board contains fifteen layers, including eight layers of traces. The fifteen layers illustrated in FIG. 1 include six 0.0015 inch-thick copper plated foil signal layers 8a–8f, seven dielectric layers 12a–12g, and two 0.007-inch thick copper layers 16, 18. Layers 16, 18 are used to interconnect each integrated circuit to electrical power and electrical ground.

Layers 16, 18 are used to minimize voltage drop, and also function as heat spreaders which minimize thermal peaks near integrated circuits. Making the power and ground layers much thicker than actually necessary for proper circuit operation as taught herein improves heat spreading beyond the capability of previous practice. The heat spreading properties associated with the power and ground layers of modern composite-layer printed wiring boards are utilized according to the principles of the invention.

Figure 2:
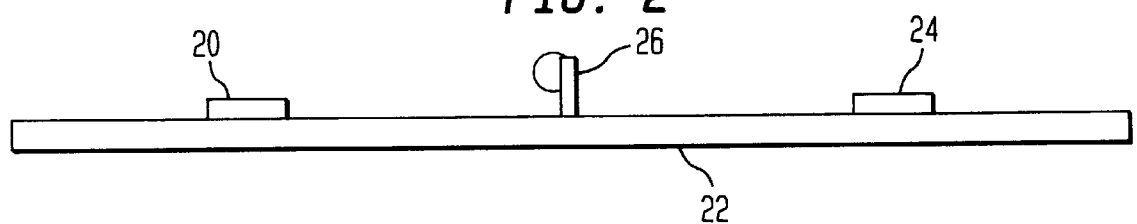
FIG. 2 is a side view of a printed willing board having a heat pipe attached thereon in accordance with the principles of the invention.

FIG. 2 is a side elevational view of a multi-layer printed wiring board having electronic devices populated thereon in accordance with the principles of the invention. With reference to FIG. 2, a first integrated circuit 20 is populated on the multi-layer printed wiring board 22. A second integrated circuit 24 is populated on the composite-layer printed wiring board 22. A heat pipe 26 is attached directly to the ground layer copper traces on the printed wiring board at a position between the first integrated circuit 20 and the second integrated circuit 24.

According to another specific embodiment of the invention, the composite-layer printed wiring board is embodied as an eight-layer board. The power and ground layers in the eight-layer board are thickened to 0.007" whereas the other conductive layers used for signal interconnections in the board are 0.0015" thick. If the power and ground layers are thickened as taught herein, the temperature of the board at the location of each integrated circuit is reduced by about 13° F. as compared to an eight-layer board in which all the layers are 0.0015" thick.

When the heat pipe is connected to a location on the layer of the printed wiring board between first and second integrated circuits, equidistant from the first and second integrated circuits, and the power and ground layers are thickened from 0.0015" to 0.007", the temperature of the board at the location of each integrated circuit can be reduced by 37° F. in comparison with an eight-layer board having uniform layer thickness where the heat pipe is connected to one of the integrated circuits.

Excellent heat paths are created by the thicker power layer, the thicker ground layer and the high density high I/O pins. Referring again to FIG. 2, when heat pipes 26 are attached to the thicker layers (e.g., the ground) of the printed wiring board 22 as taught herein, the pin-outs of each integrated circuit conduct heat out of the integrated circuits and the thick copper ground (or power) layer spreads heat from the integrated circuits. Implanting heat pipes 26 on the thick copper ground (or power) layer according to the principles of the invention conducts heat away from the integrated circuits.

Heat pipes are made an integral part of a standard printed wiring board shape, before the details of the circuitry are known. The circuitry design process is commenced with the heat pipes already laid out on the printed wiring board so that an engineer will not have to custom design the heat pipe layout after the integrated circuits are already positioned.

Figure 3:
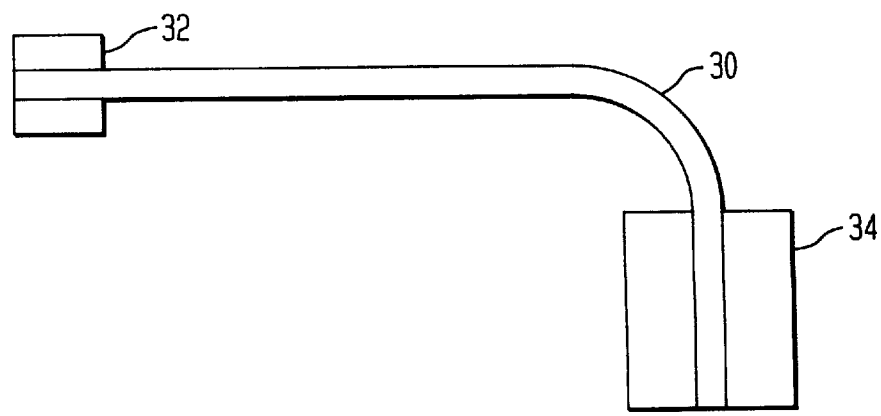
FIG. 3 is a plan view of a conventional heat pipe arrangement used to remove heat from an integrated circuit.

FIG. 3 is a plan view of a conventional heat pipe arrangement used to remove heat from a printed wiring board disposed beneath the heat pipe. With reference to FIG. 3, a heat pipe 30 includes a heat input end and a heat output end. A top face of a small conductive pad 32 is welded to the heat input end of the heat pipe 30. A bottom face of the small conductive pad 32 is glued to an integrated circuit component (not shown) such as a high-speed microprocessor that becomes heated. The small pad 32 at the heat input end absorbs heat from the integrated circuit component. The heat output end of the heat pipe 30 is permanently connected to the surrounding equipment frame 34 to dissipate heat to the free air.

Figure 4:
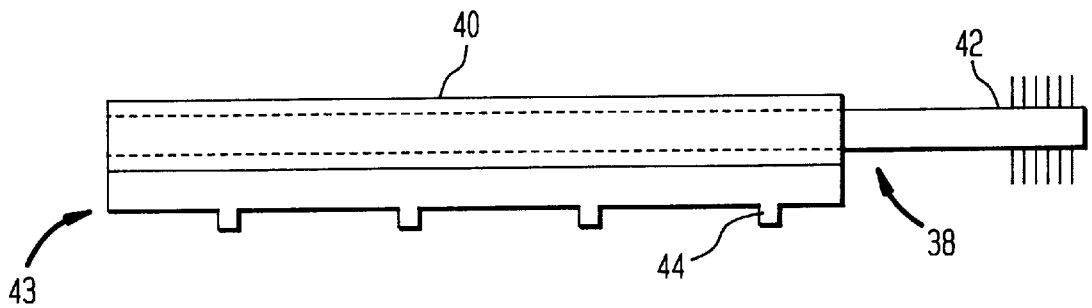
FIG. 4 is a side view of an apparatus for dissipating heat from a printed wiring board in accordance with the principles of the invention.

According to the principles of the invention, heat pipes are populated on the printed wing board like an ordinary integrated circuit. Pins (or tabs) made integral with the heat pipe are coupled to the printed wiring board. FIG. 4 shows a side view of an apparatus for dissipating heat from a printed wiring board in accordance with the principles of the invention.

With reference to FIG. 4, the apparatus includes a heat pipe 38. The heat pipe 38 includes a heat input section 40 and a heat output section 42. A thin sheet of metal 43 is disposed around the heat input section 40 of the heat pipe 38. The thin sheet of metal 43 is swaged or welded to the heat pipe 38. The sheet of metal 43 presents a series of tabs 44. The tabs 44 on the sheet metal 43 are sized to fit into plated-through holes in a printed wiring board (not shown). Such plated-through holes are typically 0.039" in diameter. The tabs 44 can also be bent at right angles to the body of the sheet metal 43 to form feet which are soldered to surface-mount pads on the printed wiring board. The thin sheet of metal 43 facilitates heat transfer from the printed wiring board, through the sheet of metal 43, through the heat input section 40 to the heat output section 42 of the heat pipe 38.

Figure 5:
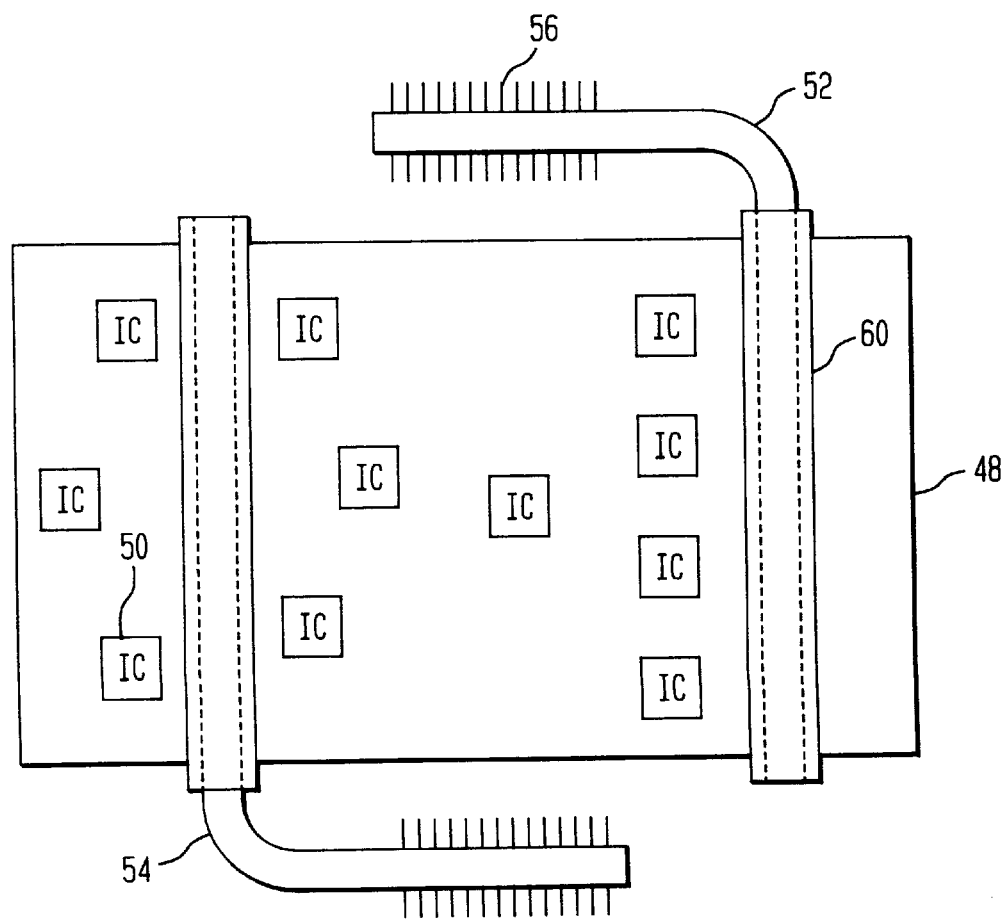
FIG. 5 is a plan view of an apparatus for dissipating heat from a printed wiring board mounted on the printed wiring board in accordance with the principles of the invention.

FIG. 5 is a plan view of an apparatus for dissipating heat from a composite-layer printed wiring board according to a specific embodiment of the invention. With reference to FIG. 5, the apparatus includes a printed wiring board 48. A plurality of integrated circuits 50 are populated on the printed wiring board 48. Two heat pipes 52, 54 are attached directly to widened stripes (not shown) of a thick copper layer of the printed wiring board 48.

Each heat pipe 52, 54 includes cooling fins 56 projecting from the heat pipe 52 at a heat output section thereof. A sheet of metal 60 is disposed around and integral with a heat input section of each heat pipe. The sheet of metal 60 presents a series of tabs (not shown). Each heat pipe 52, 54 is connected to the printed wiring board 48 by soldering the set of tabs projecting from the sheet of metal 60 disposed around the heat input section into plated-through holes in the printed wiring board 48. Alternatively, the tabs are bent at right angles and then soldered to the composite-layer printed wiring board on surface-mount pads.

Figure 6:
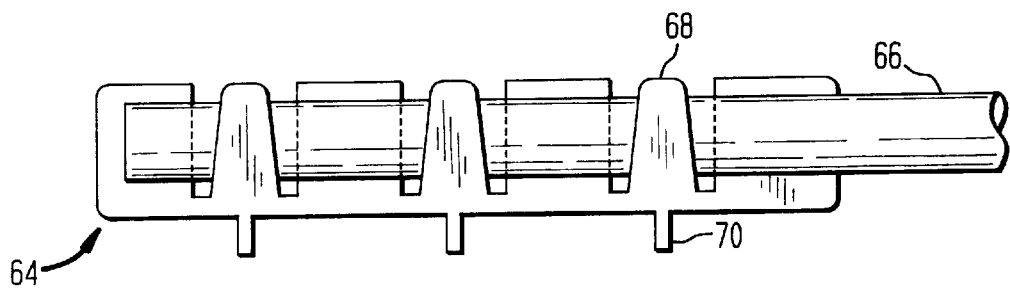
FIG. 6 is a side view of an apparatus for dissipating heat from a printed wiring board in accordance with the principles of the invention.

FIG. 6 is a side view of another specific embodiment of an apparatus for dissipating heat from a printed wiring board according to the principles of the invention. With reference to FIG. 6, the apparatus includes a sheet of metal 64 coupled to a heat pipe 66. The sheet of metal 64 is formed into a row of spring arm sections 68 and a row of tabs 70 projecting from the sheet metal 64. The row of spring arm sections 68 defines a housing to receive the heat pipe 66.

The sheet of metal 64 is independently installed in a printed wiring board (not shown). The heat pipe 66 includes a heat input section. The heat input section of the heat pipe 66 can be removably inserted into the spring arm sections 68 of the sheet metal 64. The heat input section is received in the sheet metal housing defined by the row of spring arm sections 68. The tabs 70 projecting from the sheet of metal 64 are inserted into plated-through holes in the printed wiring board. The heat input section is inserted through the row of spring arm sections 68 and held in place by the friction of the spring arm sections 68 against the outer surface of the heat pipe 66.

Figure 7:
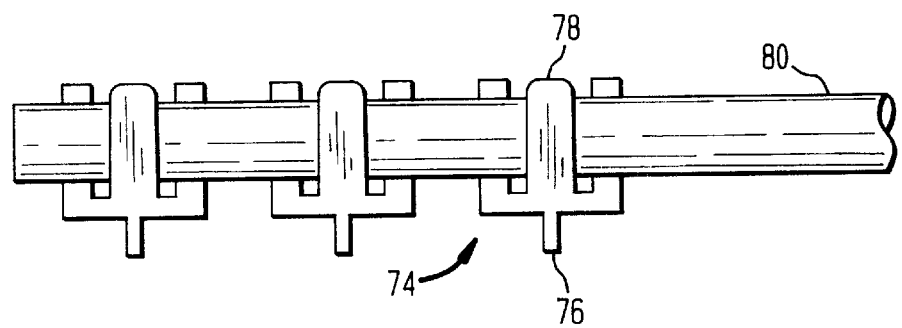
FIG. 7 is a side view of an apparatus for dissipating heat from a printed wiring board in accordance with the principles of the invention.

FIG. 7 is a side view of another embodiment of an apparatus for dissipating heat from a printed wiring board in accordance with the principles of the invention. With reference to FIG. 7, the apparatus includes a set of standardized sheet metal clips 74. Each clip 74 presents a tab 76 and a spring arm section 78.

A heat pipe 80 includes a heat input section. The heat input section is inserted through a row of spring arm sections 78. Several such clips 74 deployed in a row are used to removably mount the heat pipe 80 to the printed wiling board (not shown). Depending on the length of the heat input section, more or fewer clips 74 can be used in the row.

Figure 8:
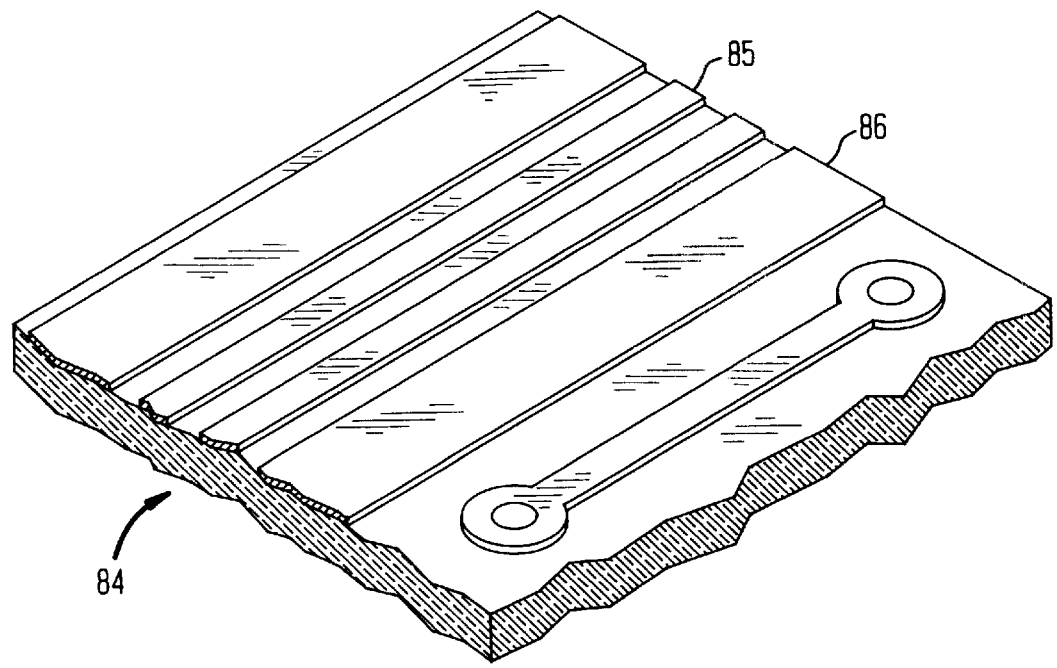
FIG. 8 is a perspective view of a single layer of a printed wiring board in accordance with the principles of the invention.

FIG. 8 is a perspective view of a layer of a multi-layer printed wiring board in accordance with the principles of the invention. With reference to FIG. 8, the printed wiring board layer 84 is initially laid out with narrower signal traces 85 and with thicker and wider copper stripes 86 that provide the connections to the power or ground distribution layers used in the circuit. In accordance with one embodiment of the invention, a row of independent clips 74 described with reference to FIG. 7 can be separately positioned on the wider copper stripes 86. A heat pipe 80 (FIG. 7) can be connected by way of the row of clips 74 to the thicker and wider copper stripes 86 of the printed wiring board.

Materials from which the conductive layers are made can include copper, gold, silver, platinum, nickel or combinations thereof.

While several particular forms of the invention have been illustrated and described, it will also be apparent that various modifications can be made without departing from the spirit and scope of the invention.

What is claimed is:

1. An apparatus, comprising:
a multi-layer printed wiring board including multiple dielectric cores and conductive layers,
the conductive layers including
a first layer and a second layer, each of the first layer and the second layer including lines;
the first layer having a first thickness and a first set of line widths, and
the second layer having a second thickness and a second set of line widths; and
a heat pipe attached to the first layer;
wherein the first thickness is greater than the second thickness.

2. The apparatus of claim 1, further comprising:
one or more plated-through holes in the printed wiring board, wherein
the heat pipe is attached to the first layer using the one or more plated-through holes.

3. The apparatus of claim 1, further comprising:
one or more surface-mount pads on the printed wiring board, wherein
the heat pipe is soldered to the one or more surface-mount pads.

4. The apparatus of claim 1, wherein:
the first set of line widths is greater than the second set of line widths.

5. The apparatus of claim 1, further comprising:
a sheet of metal disposed around the heat pipe,
the sheet of metal including a row of tabs, and
the row of tabs are connected to the printed wiring board.

6. An apparatus comprising:
a multi-layer printed wiring board having at least one layer composed of copper traces,
wherein the at least one layer is substantially thicker than the other layers of the multi-layer printed wiring board; and
at least one heat pipe connected to the printed wiring board removing heat from the printed wiring board; wherein
the at least one heat pipe is connected to the printed wiring board using plated-through-holes in the printed wiring board.

7. The apparatus of claim 6, wherein:
the at least one layer is connected to electrical power.

8. The apparatus of claim 6, wherein:
the at least one layer is connected to electrical ground.

9. An apparatus, comprising:
a multi-layer printed wiring board having at least one layer composed of copper traces,
wherein the at least one layer is substantially thicker than the other layers of the multi-layer printed wiring board; and
at least one heat pipe connected to the printed wiring board removing heat from the printed wiring board; wherein
the heat pipe is connected by solder to surface-mount pads on the printed wiring board.

10. An apparatus, comprising:
a multi-layer printed wiring board having at least one layer composed of copper traces,
wherein the at least one layer is substantially thicker than the other layers of the multi-layer printed wiring board;
at least one heat pipe connected to the printed wiring board removing heat from the printed wiring board;
a sheet of metal disposed around the heat pipe,
the sheet of metal including a row of tabs, and
the row of tabs is connected to the printed wiring board.

* * * * *

UNITED STATES PATENT AND TRADEMARK OFFICE
CERTIFICATE OF CORRECTION

PATENT NO. : 6,160,223
DATED : December 12, 2000
INVENTOR(S) : Frank Vernon Gates It is certified that error appears in the above-identified patent and that said Letters Patent is hereby corrected as shown below:

ON THE TITLE PAGE

[54] Change the title to --APPARATUS AND METHOD FOR DISSIPATING HEAT FROM A PRINTED WIRING BOARD--

Signed and Sealed this

Twenty-ninth Day of May, 2001

*Attest:*

NICHOLAS P. GODICI

*Attesting Officer*   Acting Director of the United States Patent and Trademark Office